United States Patent
Isono et al.

(10) Patent No.: US 7,456,790 B2
(45) Date of Patent: Nov. 25, 2008

(54) HIGH FREQUENCY ANTENNA DEVICE AND METHOD OF MANUFACTURING THE SAME, HF ANTENNA PRINTED CIRCUIT BOARD FOR HF ANTENNA DEVICE, AND TRANSMITTING AND RECEIVING DEVICE USING HF ANTENNA DEVICE

(75) Inventors: Tadashi Isono, Mito (JP); Kazuo Matsuura, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 317 days.

(21) Appl. No.: 11/206,819

(22) Filed: Aug. 19, 2005

(65) Prior Publication Data

US 2006/0097912 A1    May 11, 2006

(30) Foreign Application Priority Data

Nov. 5, 2004   (JP) ............................. 2004-321690

(51) Int. Cl.
*H01Q 1/38* (2006.01)
(52) U.S. Cl. ................................. 343/700 MS; 343/713
(58) Field of Classification Search .......... 343/700 MS, 343/713, 711, 872, 712; 342/175, 70
See application file for complete search history.

(56) References Cited

U.S. PATENT DOCUMENTS

| | | | |
|---|---|---|---|
| 6,249,242 B1 * | 6/2001 | Sekine et al. ................. | 342/70 |
| 2002/0025794 A1 * | 2/2002 | Tamaki et al. ................ | 455/313 |
| 2003/0016162 A1 * | 1/2003 | Sasada et al. ................. | 342/70 |
| 2004/0075604 A1 | 4/2004 | Nakazawa et al. | |
| 2005/0030231 A1 * | 2/2005 | Nagaishi et al. ....... | 343/700 MS |

FOREIGN PATENT DOCUMENTS

| | | |
|---|---|---|
| EP | 0 978 729 A2 | 2/2000 |
| EP | 1 280 225 A2 | 1/2003 |
| EP | 1 307 078 A2 | 5/2003 |
| EP | 1 462 822 A1 | 9/2004 |
| FR | 2 710 195 A1 | 3/1995 |
| FR | 2 849 927 A1 | 7/2004 |
| JP | 11-163185 | 6/1999 |
| JP | A-2003-133801 | 5/2003 |
| JP | 2003-280901 | 10/2003 |

* cited by examiner

*Primary Examiner*—HoangAnh T Le
(74) *Attorney, Agent, or Firm*—Crowell & Moring LLP

(57) ABSTRACT

A high frequency antenna device is provided which includes: a high frequency antenna wiring board having a film antenna formed on one surface of a dielectric substrate made up of multiple, laminated ceramic layers and a high frequency circuit formed on the other surface of the dielectric substrate to generate a high frequency signal; a plate-like metal base having a square opening cut therethrough; and a cover to package a surface of the high frequency circuit on the high frequency antenna wiring board after the high frequency antenna wiring board has been fitted in the opening of the metal base; wherein a periphery of the high frequency antenna wiring board is airtightly sealed and joined to the metal base with glass or brazing metal.

7 Claims, 5 Drawing Sheets

FIG.2A ANTENNA SURFACE (FRONT SURFACE)
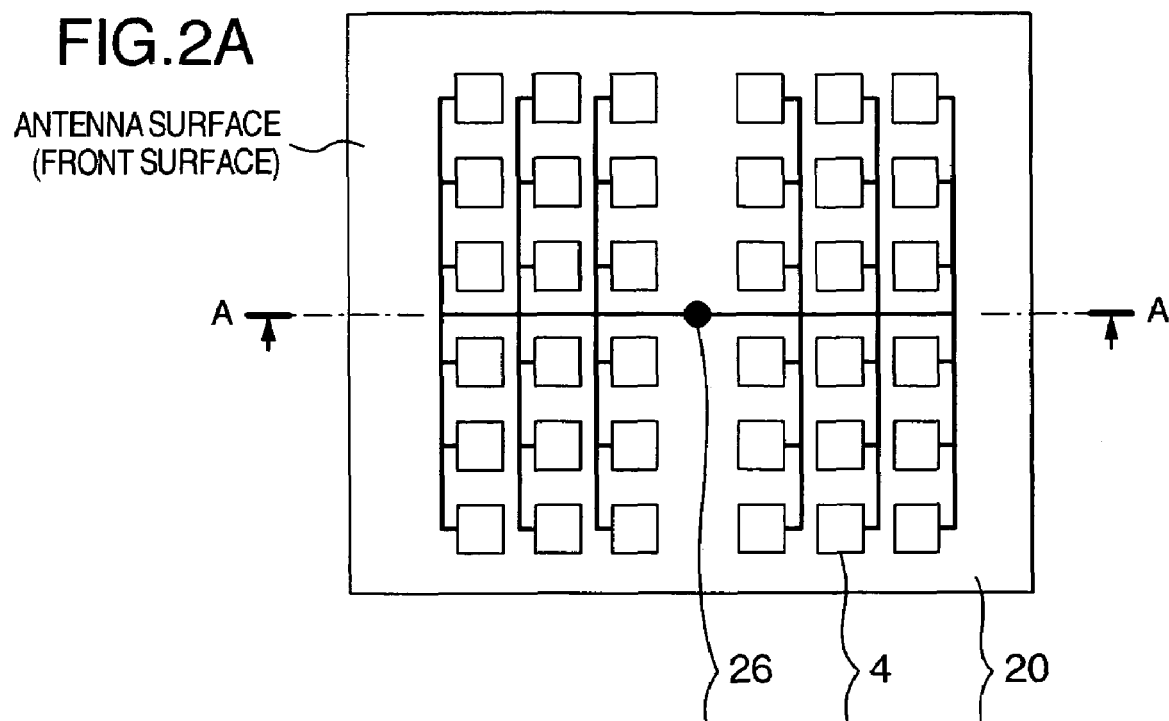
FIG.2B
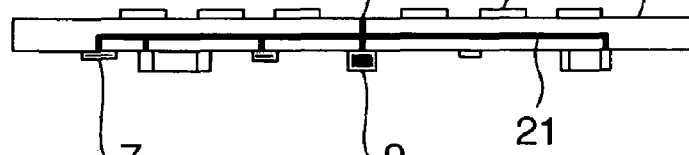
FIG.2C SURFACE OF HIGH FREQUENCY CIRCUIT (BACK SURFACE)
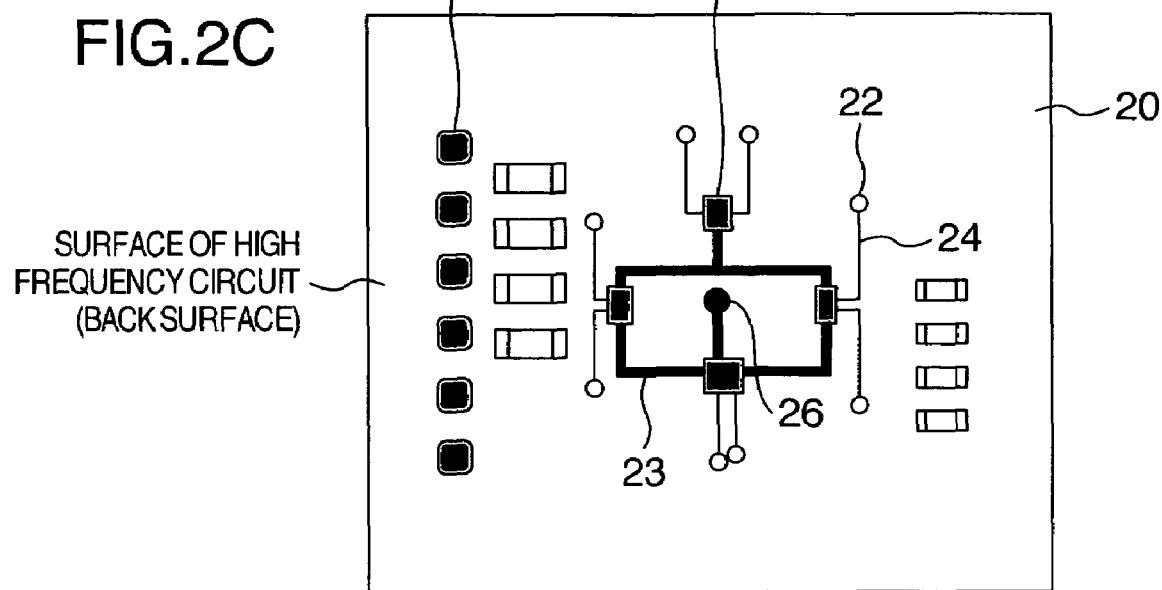

SETTING WIRING BOARD

HEATING AND BAKING

APPLYING JOINING MATERIAL

MOUNTING ELECTRONIC COMPONENT

WIRE BONDING

WELDING COVER

FIG.5A
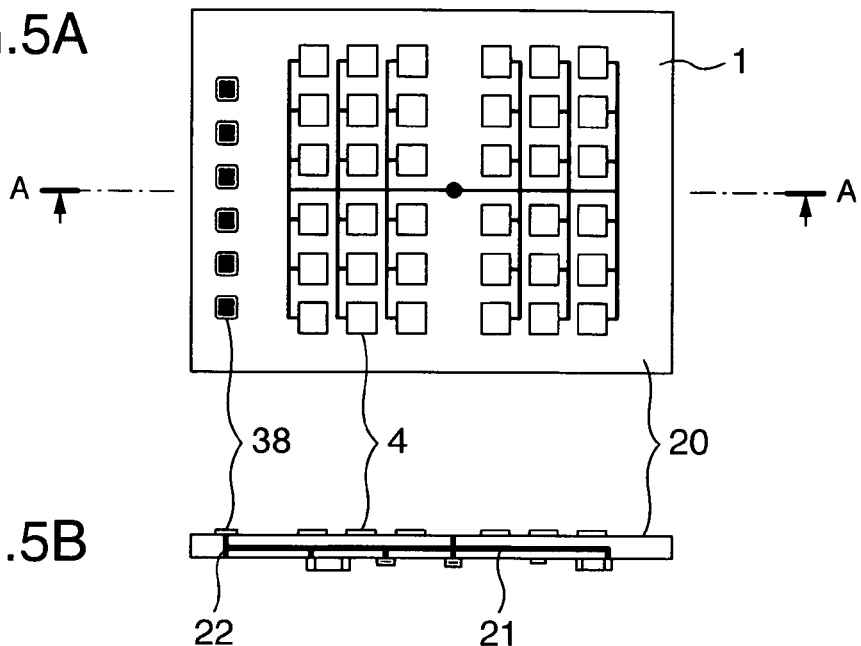
FIG.5B
FIG.6
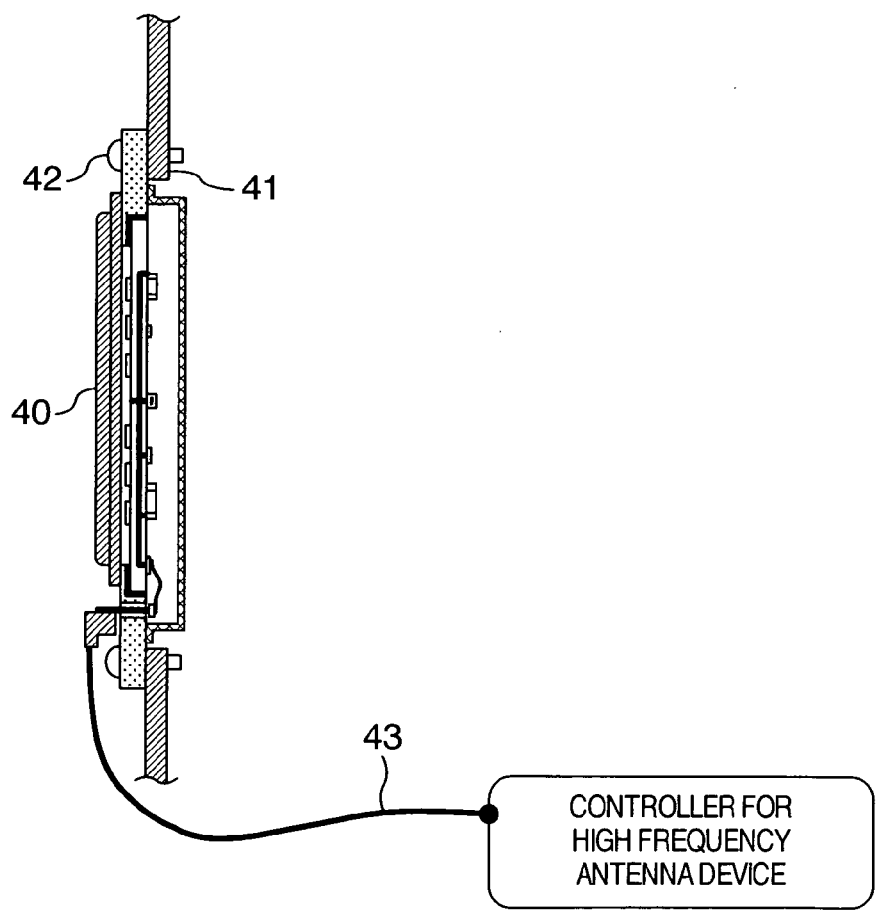

HIGH FREQUENCY ANTENNA DEVICE AND METHOD OF MANUFACTURING THE SAME, HF ANTENNA PRINTED CIRCUIT BOARD FOR HF ANTENNA DEVICE, AND TRANSMITTING AND RECEIVING DEVICE USING HF ANTENNA DEVICE

BACKGROUND OF THE INVENTION

The present invention relates to a high frequency circuit module having an antenna attached to a monolithic microwave integrated circuits (hereinafter referred to as MMICs) formed on top and bottom surfaces of a multi-layered dielectric substrate, and more specifically to an antenna device used at high frequencies such as microwaves and millimeter waves.

Millimeter wave radars have been developed as sensors used in an automotive safe driving support system, a most effective means for reducing traffic accidents and congestions, solving environmental issues of exhaust emissions and noise, and bringing a traffic ITS (intelligent transport system) into wider use. In recent years, efforts are being made to develop millimeter wave radars for automotive use. For wider use of the automotive millimeter wave radars on common passenger cars, there are growing demands for reducing the cost and size of high frequency antenna device.

As a high frequency antenna device suited for the automotive millimeter wave radar, a conventional device has a construction in which a film antenna pattern is formed on one surface of a multi-layered ceramic substrate and a high frequency circuit including MMIC is formed on the other surface (see, for example, JP-A-2003-133801 (page 6, FIG. 7)).

The official gazette of JP-A-2003-133801 discloses a high frequency circuit module (RF circuit module) which has an airtight seal lid 4 mounted on the upper surface of a multi-layered dielectric substrate 2 to airtightly seal RF circuit components, such as metal patterns forming single layer capacitors 13, chip components 14 and microstrip lines, in addition to a plurality of MMICs 5-1, 5-2. In the JP-A-2003-133801, the high frequency circuit module designed to reduce radiation loss, passage loss and transmission loss in a millimeter wave transmission line integrates the antenna with the high frequency circuit to reduce the number of constitutional components, thereby realizing the smaller size and reduced cost.

That is, the package structure of the high frequency circuit module disclosed in JP-A-2003-133801, as shown in FIG. 7 of the official gazette, is characterized by an airtight seal lid 4 which is made of a metal or an insulating material surface-plated with a metal to protect MMICs mounted on the high frequency circuit against water in atmosphere and which is soldered to the hard multi-layered dielectric substrate 2 with eutectic solder or the like to form a hermetically sealed package in order to suppress degradation of the millimeter wave RF circuit made up of millimeter wave MMICs 5 due to temperature and humidity environment.

SUMMARY OF THE INVENTION

The process of fabricating the high frequency antenna device of JP-A-2003-133801 involves: first mounting electronic components (RF circuit components) on a surface of the high frequency circuit made of a metal pattern 1 that forms an antenna; and then putting a brazing alloy such as solder between the airtight seal lid 4 formed of a metal or an insulating material surface-plated with a metal and the surface of the high frequency circuit of the metal pattern 1 mounted with electronic components (RF circuit components) and heating the brazing alloy in a high temperature reflow furnace to form a hermetically sealed package.

However, in the high frequency antenna device of JP-A-2003-133801, since, at the final stage of the fabrication process where the package is formed in the high temperature reflow furnace, the device is heated to high temperatures, the electronic components (RF circuit components) and joint materials mounted up to that stage need to have enough heat resistance to withstand the heating temperature. This gives rise to a problem of imposing limitations on the selection of constitutional components of the high frequency antenna device, making it necessary to use expensive, special specification components.

Further, when it is attempted to realize the final airtight seal package with a brazing alloy, the heat used to melt the brazing alloy also raises the pressure in the package, making an airtightness failure more likely and lowering the productivity.

Another problem is that if the metal pattern 1 forming the antenna of the high frequency antenna device is formed on the ceramic substrate, it is difficult for the ceramic substrate alone to provide sufficient strength to withstand the handling during the fabrication process and to be mounted on an automotive part.

Further, as to electrical connections with a control circuit for controlling the high frequency antenna device and with the signal processing circuit for converting an output signal from the antenna device into a desired signal, their productivity and reliability must be taken into consideration.

An object of this invention is to provide a high frequency antenna device capable of overcoming the problems experienced with the conventional technologies, a method of manufacturing the high frequency antenna device, a high frequency antenna wiring board used in the high frequency antenna device, and a transmitting and receiving device using the high frequency antenna device.

Another object of this invention is to provide a high frequency antenna device which is formed on a ceramic substrate and which has enough mechanical strength to withstand such onerous environment as experienced when mounted in automobiles and still has an inexpensive mounting structure with high productivity; a method of manufacturing the high frequency antenna device; a high frequency antenna wiring board used in the high frequency antenna device; and a transmitting and receiving device using the high frequency antenna device.

Viewed from one aspect, the present invention provides a high frequency antenna device which comprises: a high frequency antenna wiring board having a film antenna formed on one surface of a dielectric substrate made up of multiple, laminated ceramic layers and a high frequency circuit formed on the other surface of the dielectric substrate to generate a high frequency signal; a plate-like metal base having a square opening cut therethrough; and a cover to package a surface of the high frequency circuit on the high frequency antenna wiring board after the high frequency antenna wiring board has been fitted in the opening of the metal base; wherein a periphery of the high frequency antenna wiring board is airtightly sealed and joined to the metal base with glass or brazing metal.

The cover and the metal base are joined by welding.

Further, the high frequency antenna device has a metal ring attached to a periphery of the high frequency antenna wiring board and airtightly sealed and joined to the high frequency antenna wiring board with glass or brazing alloy to reinforce the high frequency antenna wiring board.

Further, the high frequency antenna wiring board has a film antenna formed on one surface of a dielectric substrate made up of multiple, laminated ceramic layers and a high frequency circuit formed on the other surface of the dielectric substrate to generate a high frequency signal, and also has input/output electrodes for the high frequency circuit formed on the same surface of the dielectric substrate that the film antenna is formed.

The method of fabricating a high frequency antenna device according to this invention comprises the steps of: forming a film antenna on one surface of a dielectric substrate made up of multiple, laminated ceramic layers, fitting the antenna in a square opening cut through a plate-like metal base, airtightly sealing and joining a periphery of the dielectric substrate to the metal base with glass or brazing alloy, and mounting electronic components of the high frequency circuit for generating a high frequency signal on the other surface of the dielectric substrate to form a high frequency antenna wiring board; and covering a surface of the high frequency circuit on the high frequency antenna wiring board with a cover and welding the cover to the metal base for airtightly sealed packaging.

The transmitting and receiving device of this invention comprises: a high frequency antenna device for transmitting or receiving a high frequency signal; a control circuit for controlling the high frequency antenna device; and a signal processing circuit for processing an output signal of the high frequency antenna device; wherein the high frequency antenna device comprises: a high frequency antenna wiring board having a film antenna formed on one surface of a dielectric substrate made up of multiple, laminated ceramic layers and a high frequency circuit formed on the other surface of the dielectric substrate to generate a high frequency signal; a plate-like metal base having a square opening cut therethrough; and a cover to package a surface of the high frequency circuit on the high frequency antenna wiring board after the high frequency antenna wiring board has been fitted in the opening of the metal base by airtightly sealing and joining a periphery of the high frequency antenna wiring board to the metal base with glass or brazing alloy.

In the transmitting and receiving device, a metal ring instead of the metal base is attached to the periphery of the high frequency antenna wiring board and is airtightly sealed and joined to the high frequency antenna wiring board with glass or brazing alloy to reinforce the high frequency antenna wiring board.

Other features of this invention will be explained in the description of the embodiments that follows.

With this invention, since the periphery of the high frequency antenna wiring board made of ceramic is airtightly sealed and joined to the metal base, or the metal ring is airtightly sealed and joined to the periphery of the high frequency antenna wiring board, by using glass or brazing alloy, the mechanical strength of the wiring board can be improved.

Further, since during the airtight sealed packaging of the high frequency circuit, the joining between the metal base and the metal cover or between the metal ring and the metal cover is realized by welding, productivity can be improved.

Further, since in the process of manufacturing the high frequency antenna device, the final package can be realized by welding, the high frequency circuit can be protected against thermal damage during packaging. That is, in selecting electronic components and joining members to be mounted on the high frequency circuit, there is no need to use relatively expensive heat resistant components.

As described above, this invention can provide an inexpensive high frequency antenna device which has a mounting structure with high productivity and a sufficient mechanical strength.

Other objects, features and advantages of the invention will become apparent from the following description of the embodiments of the invention taken in conjunction with the accompanying drawings.

BRIEF DESCRIPTION OF THE DRAWINGS

FIGS. 2A-2C are overall structural views showing a high frequency antenna wiring board of the high-frequency antenna device of FIGS. 1A-1C, FIG. 2A representing a top view of the high frequency antenna wiring board, FIG. 2B representing a cross-sectional view taken along the line A-A of FIG. 2A, FIG. 2C representing a bottom view of the high frequency antenna wiring board.

FIGS. 5A-5B are overall structural views showing an example of a high frequency antenna wiring board used in the first and second embodiment of the high frequency antenna device of FIGS. 1A-1C and in the third embodiment of the high frequency antenna device of FIGS. 4A-4C, FIG. 5A representing a top view of the high frequency antenna wiring board, FIG. 5B representing a cross-sectional view taken along the line A-A of FIG. 5A.

FIG. 6 illustrate an example of a transmitting and receiving device using the high frequency antenna device of this invention.

DETAILED DESCRIPTION OF THE EMBODIMENTS

A high frequency antenna device of this invention comprises: a high frequency antenna wiring board having a film antenna formed on one surface of a dielectric substrate made up of multiple, laminated ceramic layers and a high frequency circuit formed on the other surface of the dielectric substrate to generate a high frequency signal; a plate-like metal base having a square opening cut therethrough; and a cover to package a surface of the high frequency circuit on the high frequency antenna wiring board after the high frequency antenna wiring board has been fitted in the opening of the metal base. This high frequency antenna device is fabricated by forming a film antenna on one surface of the dielectric substrate, fitting the dielectric substrate in the opening of the metal base, airtightly sealing and joining a periphery of the dielectric substrate to the metal base with glass or brazing alloy, and mounting electronic components of the high frequency circuit for generating a high frequency signal on the other surface of the dielectric substrate to form a high frequency antenna wiring board; and then by covering a surface of the high frequency circuit on the high frequency antenna wiring board with a cover and welding the end of the cover to the metal base to airtightly package the high frequency antenna wiring board.

Embodiment 1

Embodiments of this invention will be described in detail in the following.

Figure 1A:
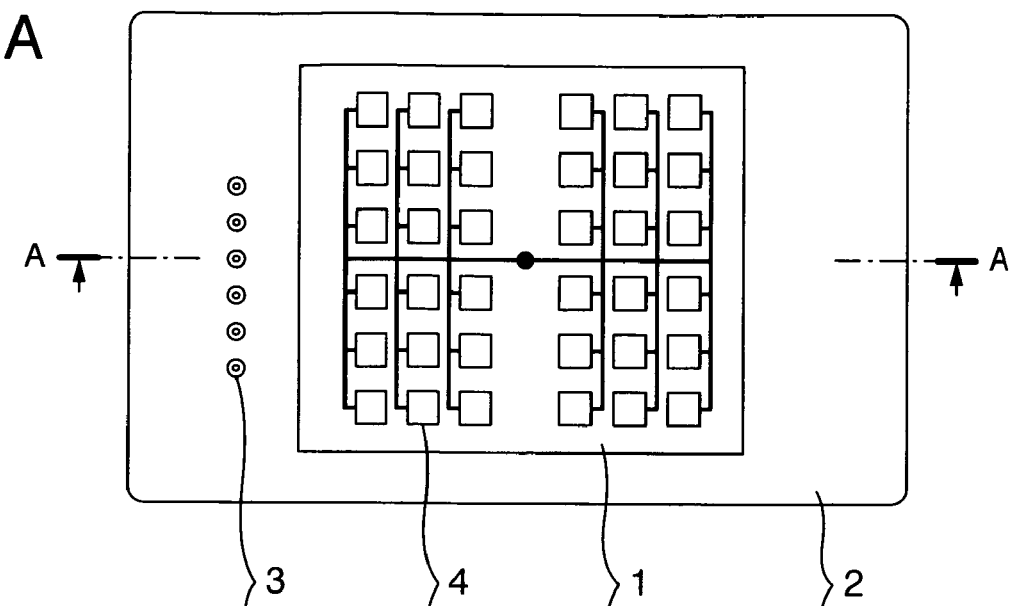
FIGS. 1A-1C are overall structural views showing a first and second embodiment of a high frequency antenna device according to the present invention, FIG. 1A representing a top view of the high frequency antenna device, FIG. 1B representing a cross-sectional view taken along the line A-A of FIG. 1A, FIG. 1C representing a partly cutaway bottom view of the high frequency antenna device.
Figure 1B:
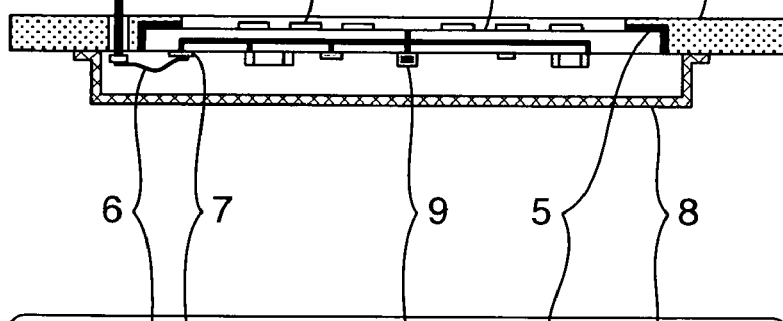
Figure 1C:
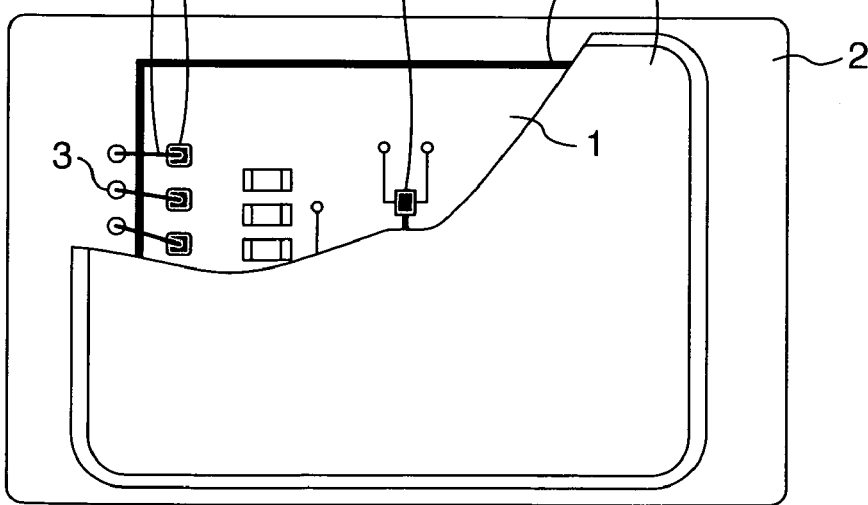

FIGS. 1A-1C and FIGS. 2A-2C illustrate a first embodiment and a second embodiment of the high frequency antenna device according to this invention. FIGS. 1A-1C show an overall construction of the first and second embodiment of the high frequency antenna device; and FIGS. 2A-2C show an example of the high frequency antenna wiring board used in the first and second embodiment of the high frequency antenna device of FIGS. 1A-1C.

In FIGS. 1A-1C, the high frequency antenna device has a high frequency antenna wiring board 1. The high frequency antenna wiring board 1 has a construction as shown in FIGS. 2A-2C. That is, the high frequency antenna wiring board 1 has as a base a dielectric substrate 20 which is formed of laminated multiple layers of ceramics and shaped in a rectangle.

This dielectric substrate 20 is formed of laminated multiple layers of ceramics. On one of surfaces (front surface) of the multi-layered dielectric substrate 20, a metal film antenna 4 is formed by a thin film fabrication technique such as vapor deposition. In an intermediate layer 21 of the dielectric substrate 20, a ground layer and a wiring layer are formed. The film antenna 4 and the ground layer and wiring layer are electrically connected to the other surface (back surface) by through vias 22.

On the other surface (back surface) of the multi-layered dielectric substrate 20 are patterned a high frequency transmission path 23 for transmitting high frequencies, voltage supply wires 24 for driving an MMIC chip such as an oscillator 9, and bonding pads 7 as input/output terminals of the high frequency antenna device.

The film antenna 4 formed on the front surface of the dielectric substrate 20 and the high frequency transmission path 23 formed on the back surface of the dielectric substrate 20 are electrically connected through feeding vias 26 filled with metal. The supply of electricity to the film antenna 4 and the transmission of power received by the film antenna 4 to the high frequency circuit are effected through the feeding vias 26.

This high frequency antenna wiring board 1 is mounted on a metal base 2. The metal base 2 is formed like a plate and has a square opening piercing through a central portion of the base. At the periphery of the opening in the metal base 2 is formed a step portion, in which the high frequency antenna wiring board 1 is fitted. The high frequency antenna wiring board 1 fitted in the opening of the metal base 2 is so mounted that the film antenna 4 formed on one surface (front surface) of the wiring board is exposed outside through the opening. Then, the edge of the high frequency antenna wiring board 1 is joined to the peripheral step portion of the opening in the metal base 2 by a seal material 5 made of glass or brazing alloy. The joining between the edge of the high frequency antenna wiring board 1 and the peripheral step portion of the opening in the metal base 2 is done prior to the mounting of electronic components such as MMIC on the high frequency antenna wiring board 1.

On the other surface (back surface) of the multi-layered dielectric substrate 20 making up the high frequency antenna wiring board 1 are formed an MMIC chip such as oscillator 9, bonding pads 7 as input/output terminals of the high frequency antenna device, and high frequency circuits including a wiring pattern for mounting electronic components and a high frequency transmission path. The bonding pads 7 are connected to external input/output terminals 3 provided on the back surface of the dielectric substrate 20 through bonding wires 6. The external input/output terminals 3, as shown in FIGS. 1A-1C, are a rod-like terminal piercing through the dielectric substrate 20 from the second surface (back surface) to the first surface (front surface).

On the side of the metal base 2 where the peripheral step portion of the opening is formed, a cover 8 is mounted to cover the second surface (back surface) of the multi-layered dielectric substrate 20 which is patterned with the high frequency transmission path 23 for transmitting high frequencies, the voltage supply wires 24 for driving the MMIC chip such as oscillator 9, and the bonding pads 7 as input/output terminals of the high frequency antenna device.

The high frequency antenna device of the first embodiment of this invention, as shown in FIGS. 2A-2C, mounts the high frequency antenna wiring board 1, which is formed with the film antenna 4 on the first surface (front surface) of the dielectric substrate 20 and with the high frequency circuits on the second surface (back surface). The high frequency antenna device of the first embodiment is characterized by joining the high frequency antenna wiring board 1 to the metal base 2 with a seal material 5 of glass or brazing alloy, as shown in FIGS. 1A-1C, prior to mounting electronic components such as MMIC.

The high frequency antenna device of the second embodiment of this invention is characterized, as shown in FIGS. 1A-1C, in that the cover 8 is welded to the metal base 2. Thus, in this high frequency antenna device of the second embodiment also, the similar effect to that of the first embodiment can be produced.

Embodiment 2

FIGS. 3A-3F show one example method of manufacturing the high frequency antenna device of the above construction.

The high frequency antenna device shown in FIGS. 1A-1C is manufactured in the form of an airtight sealed package by forming a film antenna 4 on the first surface (front surface) of the dielectric substrate 20 made up of multiple layers of ceramics; fitting the dielectric substrate 20 in a square opening cut through a plate-like metal base 2; joining the outer circumference of the dielectric substrate 20 to the metal base 2 by sealing them airtightly with glass or brazing alloy; mounting electronic components of high frequency circuits for generating high frequency signals on the second surface (back surface) of the dielectric substrate 20 to build the high frequency antenna wiring board 1; covering the surface of the high frequency circuit on the high frequency antenna wiring board 1; and welding the cover 8 and the metal base 2 to obtain the airtight sealed package.

The method of manufacturing the high frequency antenna device shown in FIGS. 1A-1C is more detailed in FIGS. 3A-3F. That is, the high frequency antenna device of FIGS. 1A-1C is manufactured in the following steps.

Figure 3A:
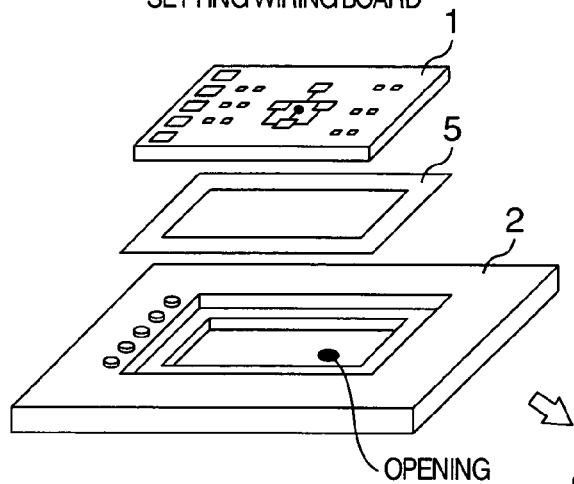
FIGS. 3A-3F illustrate a process of fabricating a high frequency antenna device as one embodiment of a method of manufacturing a high frequency antenna device of this invention.

(1) First, in a through-hole (square opening) cut through the metal base 2 of an iron-nickel alloy, the seal material 5 of glass or brazing alloy and the high frequency antenna wiring board 1, which has the film antenna 4 formed on one surface (front surface) of the dielectric substrate 20, are inserted and set so that the film antenna 4 can be seen from outside through the opening in the metal base 2 (wiring board setting step of FIG. 3A).

Figure 3B:
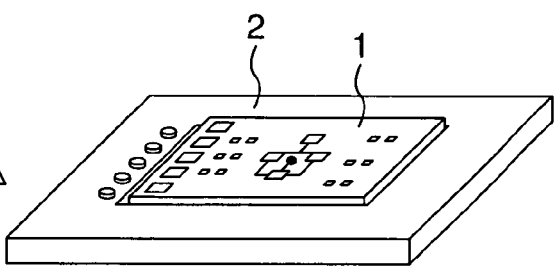

(2) Second, the entire metal base 2 is heated and baked to a temperature equal to a melting point of the seal material 5 of glass or brazing alloy interposed between the high frequency antenna wiring board 1 and the metal base 2 (baking step of FIG. 3B).

Figure 3C:
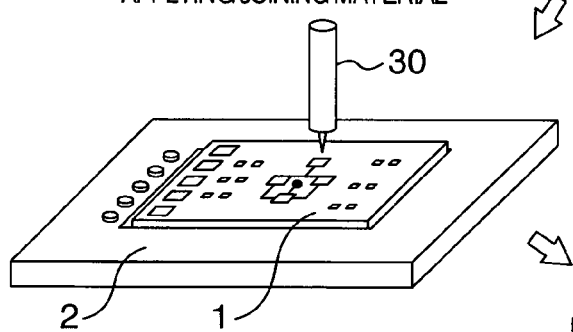

(3) Third, a bonding material such as Ag paste and solder paste is applied from a dispenser 30 to the second surface (back surface) of the dielectric substrate 20 making up the high frequency antenna wiring board 1 (bonding material application step of FIG. 3C).

Figure 3D:
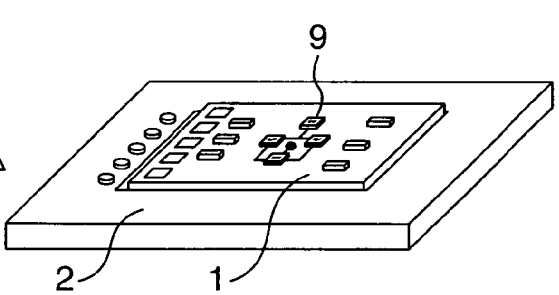

(4) Fourth, electronic components such as oscillator 9 are mounted on those portions of the surface of high frequency circuit on the high frequency antenna wiring board 1 which are applied with the bonding material such as Ag paste and solder paste from the dispenser 30 (electronic component mounting step of FIG. 3D).

Figure 3E:
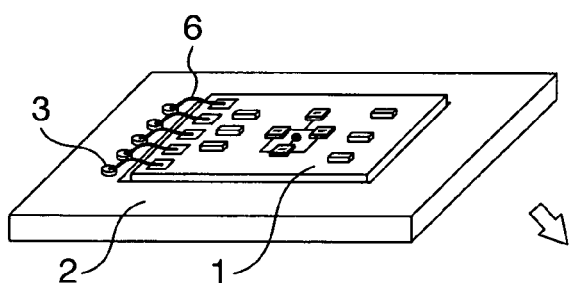

(5) Fifth, using bonding wires 6, electronic components such as MMIC chip including oscillator 9 are connected to the external input/output terminals 3 (wire bonding step of FIG. 3E).

Figure 3F:
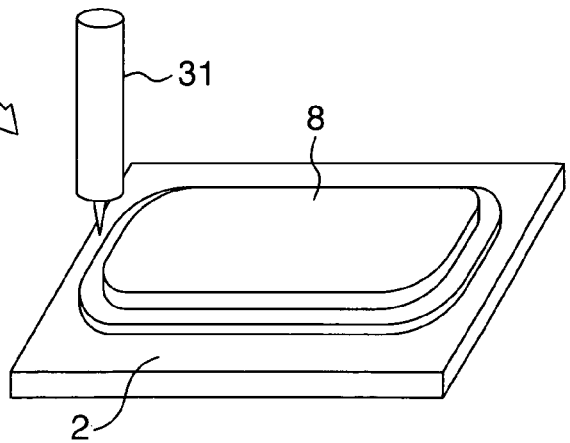

(6) Sixth, the cover 8 is placed on the high frequency circuit side of the high frequency antenna wiring board 1, and the peripheral portion of the cover 8 is laser-welded by a laser welder 31 in the presence of a dry nitrogen gas (cover welding step of FIG. 3F).

As described above, in the high frequency antenna device manufacturing method shown in FIGS. 3A-3F, since the high frequency antenna wiring board 1 is airtightly sealed and joined to the metal base 2 by the seal material 5, the dielectric substrate 20 forming the high frequency antenna wiring board 1 can be protected against damage during the handling in the component mounting process (bonding material application step of FIG. 3C, electronic component mounting step of FIG. 3D, and wire bonding step of FIG. 3E). Therefore, the mechanical strength of the high frequency antenna device fabricated with this method can be improved.

The construction in which, on the second surface (back surface) of the dielectric substrate 20 forming the high frequency antenna wiring board 1, a bonding material such as Ag paste and solder paste is applied by the dispenser 30 and in which the high frequency antenna wiring board 1 is airtightly sealed and joined to the metal base 2 by the seal material 5 prior to mounting electronic components such as oscillator 9 to where the bonding material was applied from the dispenser 30, is also the feature of the high frequency antenna device of the first embodiment. So, the similar effect to that of the high frequency antenna device manufacturing method can also be produced by the high frequency antenna device of the first embodiment.

In the high frequency antenna device manufacturing method shown in FIGS. 3A-3F, the sealing and joining of the cover 8 can be done by welding as shown in the cover welding step of FIG. 3F. Therefore, in a step of melting a brazing alloy at high temperatures (heating and baking step) in the conventional final packaging process, there is almost no need to consider heat resistances of the electronic component bonding materials and of electronic components mounted in a package. Further, as shown in the cover welding step of FIG. 3F, since the periphery of the cover 8 is laser-welded as by the laser welder 31 after the heating and baking step of FIG. 3B, the wiring board is not exposed to such high temperatures as experienced in the heating and baking step of FIG. 3B. Therefore, it is possible to choose as an electrical joining material for electronic components such materials as Ag paste which makes a joint at relatively low temperatures. This in turn obviates the need to use special electronic components in terms of heat resistance, easily realizing the antenna device with inexpensive components.

Further, as shown in the cover welding step of FIG. 3F, since the periphery of the cover 8 is laser-welded as by the laser welder 31, the time required by the welding work is short, allowing for a continuous welding and therefore improving productivity.

According to the example method of manufacturing the high frequency antenna device as shown in FIGS. 3A-3F, a high frequency antenna device having a mounting construction with high productivity can be provided at low cost while maintaining the mechanical strength.

That is, since the construction of the high frequency antenna device of the first and second embodiment can apply the high frequency antenna device manufacturing method shown in FIGS. 3A-3F, the same effect as that of the high frequency antenna device manufacturing method shown in FIGS. 3A-3F can be produced.

Although the cover welding step of FIG. 3F in the high frequency antenna device manufacturing method shown in FIGS. 3A-3F takes for example the laser welding by the laser welder 31, a resistance welding such as seam welding and ring projection welding may also be employed.

Embodiment 3

Figure 4A:
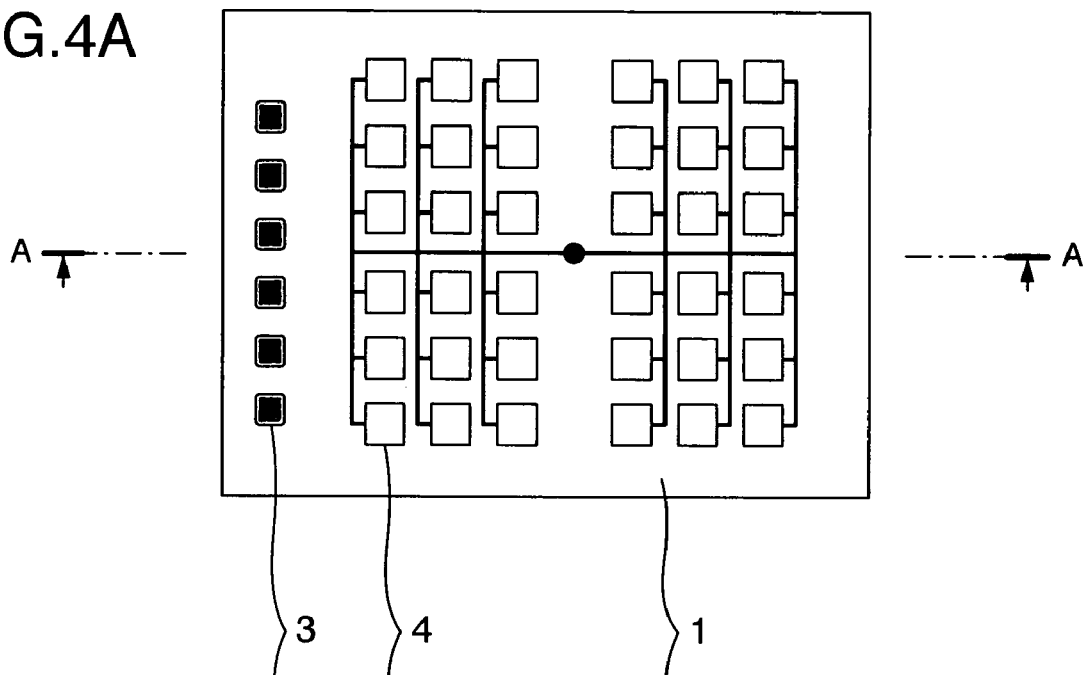
FIGS. 4A-4C are overall structural views showing a third embodiment of the high frequency antenna device according to this invention, FIG. 4A representing a top view of the high frequency antenna device, FIG. 4B representing a cross-sectional view taken along the line A-A of FIG. 4A, FIG. 4C representing a partly cutaway bottom view of the high frequency antenna device.
Figure 4B:
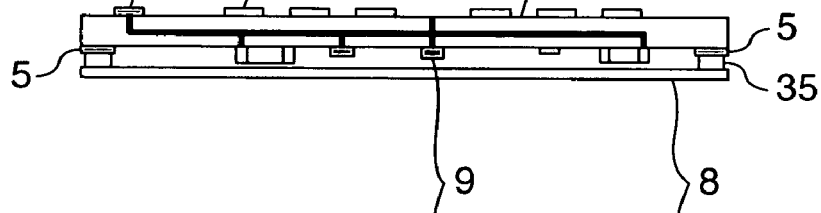
Figure 4C:
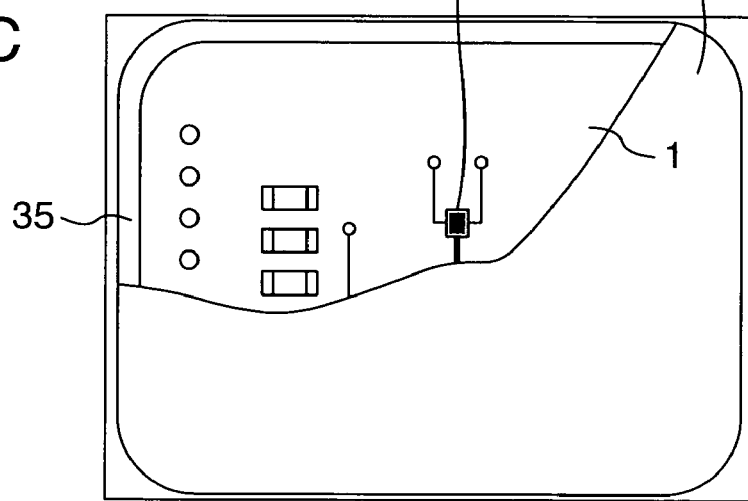

FIGS. 4A-4C show a third embodiment of the high frequency antenna device according to this invention.

In FIGS. 4A-4C, the high frequency antenna device of the third embodiment shown in FIGS. 4A-4C differs from the high frequency antenna device of the first and second embodiment shown in FIGS. 1A-1C as follows. In the high frequency antenna device of the first and second embodiment shown in FIGS. 1A-1C, the high frequency antenna wiring board 1 is airtightly sealed and joined to the plate-like metal base 2 with the seal material 5 of glass or brazing alloy, the metal base having a square opening cut through the central part thereof, whereas in the high frequency antenna device of the third embodiment shown in FIGS. 4A-4C, a metal ring 35 is used instead of the metal base 2 and is airtightly sealed and joined to the periphery of the high frequency antenna wiring board 1 with the seal material 5 of glass or brazing alloy. In other respects, the construction of the third embodiment is similar to that of the first and second embodiment.

In the high frequency antenna device of the third embodiment shown in FIGS. 4A-4C, the metal ring 35 acts as a reinforcement of the high frequency antenna wiring board 1 and can be seam-welded to the cover 8 of the airtight sealed package as the final product. Therefore, the high frequency antenna device of the third embodiment shown in FIGS. 4A-4C can produce the similar effects to those of the first and second embodiment.

Embodiment 4

FIGS. 5A-5B show another example of high frequency antenna wiring board used in the high frequency antenna device of this invention.

In FIGS. 5A-5B, the high frequency antenna wiring board used in the high frequency antenna device of this invention is characterized in that a film antenna 4 is formed on one surface (front surface) of the dielectric substrate 20 made up of multiple layers of ceramics and that electrodes 38 as input/output terminals of the high frequency antenna device are formed on the same surface (front surface) that the film antenna 4 is formed. These electrodes 38 are electrically connected by through vias 22 to the wire layer formed in an intermediate layer 21 of the dielectric substrate 20 which makes up the high frequency antenna wiring board 1.

The use of the high frequency antenna wiring board 1 as shown in FIGS. 5A-5B in constructing a high frequency antenna device can simplify the terminals for connection with the outside of the package, which in turn helps reduce the size of the package and therefore the cost of the terminal members.

By using the high frequency antenna wiring board 1 shown in FIGS. 5A-5B, it is thus possible to provide a high frequency antenna device less costly than the high frequency antenna device of the first embodiment.

Embodiment 5

FIG. 6 shows an embodiment of a transmitting and receiving device using the high frequency antenna device of this invention.

In FIG. 6 the transmitting and receiving device using the above high frequency antenna device more specifically has a radome 40 mounted on the high frequency antenna device to protect the surface of the antenna. The high frequency antenna device with the radome is then secured as by screws 42 to a mounting portion 41 on, for example, an automobile, with a controller for the high frequency antenna device mounted at a separate location and with electric signals transferred through a signal line 43.

A first example of the transmitting and receiving device uses the high frequency antenna device of this invention shown in FIG. 1, the high frequency antenna device comprising: a high frequency antenna wiring board 1 having a film antenna 4 formed on one surface of a dielectric substrate 20 made up of multiple layers of ceramics and a high frequency circuit formed on the other surface of the dielectric substrate 20 to generate a high frequency signal; a plate-like metal base 2 having a square opening cut therethrough, the metal base 2 being airtightly sealed and joined to a periphery of the high frequency antenna wiring board 1 by using glass or brazing alloy when the high frequency antenna wiring board 1 is fitted in the opening of the metal base 2; and a cover 8 to package a surface of the high frequency circuit on the high frequency antenna wiring board 1.

A second example of the transmitting and receiving device uses the high frequency antenna device of this invention shown in FIGS. 4A-4C, the high frequency antenna device comprising: a high frequency antenna wiring board 1 having a film antenna 4 formed on one surface of a dielectric substrate 20 made up of multiple layers of ceramics and a high frequency circuit formed on the other surface of the dielectric substrate 20 to generate a high frequency signal; a metal ring 35 airtightly sealed and joined to the periphery of the high frequency antenna wiring board 1 by using glass or brazing alloy; and a cover to package the surface of the high frequency circuit on the high frequency antenna wiring board.

As the high frequency antenna wiring board of the high frequency antenna device used in the transmitting and receiving device of FIG. 6, it is of course possible to use the high frequency antenna wiring board shown in FIGS. 5A-5B in which a film antenna 4 is formed on one surface (front surface) of the dielectric substrate 20 made up of multiple layers of ceramics and in which the electrodes 38 as input/output terminals of the high frequency antenna device are formed on the same surface (front surface) that the film antenna 4 is formed, and are electrically connected by through vias 22 to the wire layer formed in an intermediate layer 21 of the dielectric substrate 20.

Generally, the high frequency antenna device accounts for a large percentage of the cost of components used in the transmitting and receiving device. So, the use of the high frequency antenna device of this invention that can be manufactured inexpensively can substantially reduce the total cost of the transmitting and receiving device.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A high frequency antenna device comprising:
    a high frequency antenna wiring board having a film antenna formed on one surface of a dielectric substrate made up of multiple, laminated ceramic layers and a high frequency circuit formed on the other surface of the dielectric substrate to generate a high frequency signal;
    a planar metal base having an opening cut therethrough; and
    a cover to package a surface of the high frequency circuit on the high frequency antenna wiring board after the high frequency antenna wiring board has been fitted in the opening of the metal base;
    wherein a periphery of the high frequency antenna wiring board is airtightly sealed and joined to the metal base with glass or brazing metal.

2. A high frequency antenna device according to claim 1, wherein the cover is joined to the metal base by welding.

3. A high frequency antenna device comprising:
    a high frequency antenna wiring board having a film antenna formed on one surface of a dielectric substrate made up of multiple, laminated ceramic layers and a high frequency circuit formed on the other surface of the dielectric substrate to generate a high frequency signal;
    a cover to package a surface of the high frequency circuit on the high frequency antenna wiring board; and
    a planar metal ring attached to a periphery of the high frequency antenna wiring board;
    wherein the metal ring and the high frequency antenna wiring board are airtightly sealed and joined with glass or brazing alloy to reinforce the high frequency antenna wiring board.

4. A method of manufacturing a high frequency antenna device comprising the steps of:
    forming a film antenna on one surface of a dielectric substrate made up of multiple, laminated ceramic layers;
    fitting the dielectric substrate in an opening cut through a planar metal base;
    airtightly sealing and joining a periphery of the dielectric substrate to the metal base with glass or brazing alloy; and
    after said sealing step, mounting electronic components of the high frequency circuit for generating a high frequency signal on the other surface of the dielectric substrate to form a high frequency antenna wiring board; and
    covering a surface of the high frequency circuit on the high frequency antenna wiring board with a cover and welding the cover to the metal base for airtightly sealed packaging.

5. A high frequency antenna wiring board in a high frequency antenna device comprising:
- a high frequency antenna wiring board having a film antenna formed on one surface of a dielectric substrate made up of multiple, laminated ceramic layers and a high frequency circuit formed on the other surface of the dielectric substrate to generate a high frequency signal;
- a planar metal base having an opening cut therethrough; and
- a cover to package a surface of the high frequency circuit on the high frequency antenna wiring board after the high frequency antenna wiring board has been fitted in the opening of the metal base;
- wherein input and output electrodes for the high frequency circuit are provided on the same surface of the dielectric substrate that the film antenna is formed; and
- a periphery of the high frequency antenna wiring board is sealed airtight and joined with glass or brazing metal to the metal base.

6. A transmitting and receiving device comprising:
- a high frequency antenna device for transmitting or receiving a high frequency signal;
- a control circuit for controlling the high frequency antenna device; and
- a signal processing circuit for processing an output signal of the high frequency antenna device;
- wherein the high frequency antenna device comprises:
- a high frequency antenna wiring board having a film antenna formed on one surface of a dielectric substrate made up of multiple, laminated ceramic layers and a high frequency circuit formed on the other surface of the dielectric substrate to generate a high frequency signal;
- a planar metal base having an opening cut therethrough; and
- a cover to package a surface of the high frequency circuit on the high frequency antenna wiring board after the high frequency antenna wiring board has been fitted in the opening of the metal base by airtightly sealing and joining a periphery of the high frequency antenna wiring board to the metal base with glass or brazing alloy.

7. A transmitting and receiving device comprising:
- a high frequency antenna device for transmitting or receiving a high frequency signal;
- a control circuit for controlling the high frequency antenna device; and
- a signal processing circuit for processing an output signal of the high frequency antenna device;
- wherein the high frequency antenna device comprises:
- a high frequency antenna wiring board having a film antenna formed on one surface of a dielectric substrate made up of multiple, laminated ceramic layers and a high frequency circuit formed on the other surface of the dielectric substrate to generate a high frequency signal;
- a planar metal ring attached to a periphery of the high frequency antenna wiring board and airtightly sealed and joined to the high frequency antenna wiring board with glass or brazing alloy; and
- a cover to package a surface of the high frequency circuit on the high frequency antenna wiring board.

* * * * *